US008841738B2

(12) United States Patent
Harney et al.

(10) Patent No.: US 8,841,738 B2
(45) Date of Patent: Sep. 23, 2014

(54) MEMS MICROPHONE SYSTEM FOR HARSH ENVIRONMENTS

(71) Applicant: Invensense, Inc., San Jose, CA (US)

(72) Inventors: Kieran P. Harney, Andover, MA (US); Jia Gao, Winchester, MA (US); Aleksey S. Khenkin, Nashua, NH (US)

(73) Assignee: Invensense, Inc., San Jose, CA (US)

( * ) Notice: Subject to any disclaimer, the term of this patent is extended or adjusted under 35 U.S.C. 154(b) by 5 days.

(21) Appl. No.: 13/632,205

(22) Filed: Oct. 1, 2012

(65) Prior Publication Data

US 2014/0091406 A1    Apr. 3, 2014

(51) Int. Cl.
*H01L 29/84*    (2006.01)

(52) U.S. Cl.
USPC .......................... 257/416; 257/777; 257/778

(58) Field of Classification Search
USPC ......................................... 257/416, 777, 778
See application file for complete search history.

(56) References Cited

U.S. PATENT DOCUMENTS

| | | | |
|---|---|---|---|
| 4,533,795 A | 8/1985 | Baumhauer, Jr. et al. | 179/111 E |
| 5,658,710 A | 8/1997 | Neukermans | 430/320 |
| 5,901,046 A | 5/1999 | Ohta et al. | 361/760 |
| 6,243,474 B1 | 6/2001 | Tai et al. | 381/174 |
| 6,324,907 B1 | 12/2001 | Halteren et al. | 73/431 |
| 6,522,762 B1 | 2/2003 | Mullenborn et al. | 381/174 |
| 6,594,369 B1 | 7/2003 | Une | 381/174 |
| 6,667,189 B1 | 12/2003 | Wang et al. | 438/53 |
| 6,704,427 B2 | 3/2004 | Kearey | 381/355 |
| 6,768,196 B2 | 7/2004 | Harney et al. | 257/729 |
| 6,781,231 B2 | 8/2004 | Minervini | 257/704 |
| 7,003,127 B1 | 2/2006 | Sjursen et al. | 381/322 |
| 7,080,442 B2 | 7/2006 | Kawamura et al. | 29/594 |
| 7,166,910 B2 | 1/2007 | Minervini | 257/704 |
| 7,242,089 B2 | 7/2007 | Minervini | 257/704 |
| 7,642,657 B2 | 1/2010 | Suilleabhain et al. | 257/778 |
| 7,822,394 B2 * | 10/2010 | Leete | 455/117 |
| 7,829,379 B2 | 11/2010 | Goida | 438/107 |
| 7,872,356 B2 | 1/2011 | Sanchez et al. | 257/777 |
| 7,880,244 B2 | 2/2011 | Kierse | 257/414 |

(Continued)

FOREIGN PATENT DOCUMENTS

EP        2252077        11/2010    ............ H04R 19/00
WO    WO 2005/036698    4/2005

OTHER PUBLICATIONS

Kopola et al., "MEMS Sensor Packaging Using LTCC Substrate Technology", Proceedings of SPIE, vol. 4592, pp. 148-158, 2001.

*Primary Examiner* — Telly Green
*Assistant Examiner* — Damian A Hillman
(74) *Attorney, Agent, or Firm* — Maryam Imam; IPxLaw Group LLP

(57) ABSTRACT

A MEMS microphone system suited for harsh environments. The system uses an integrated circuit package. A first, solid metal lid covers one face of a ceramic package base that includes a cavity, forming an acoustic chamber. The base includes an aperture through the opposing face of the base for receiving audio signals into the chamber. A MEMS microphone is attached within the chamber about the aperture. A filter covers the aperture opening in the opposing face of the base to prevent contaminants from entering the acoustic chamber. A second metal lid encloses the opposing face of the base and may attach the filter to this face of the base. The lids are electrically connected with vias forming a radio frequency interference shield. The ceramic base material is thermally matched to the silicon microphone material to allow operation over an extended temperature range.

26 Claims, 4 Drawing Sheets

(56) References Cited

U.S. PATENT DOCUMENTS

| | | | |
|---|---|---|---|
| 8,129,803 B2 | 3/2012 | Martin et al. | 257/415 |
| 8,447,075 B2 * | 5/2013 | Wilson et al. | 382/110 |
| 8,571,249 B2 * | 10/2013 | Wang | 381/355 |
| 2005/0189635 A1 * | 9/2005 | Humpston et al. | 257/678 |
| 2007/0013052 A1 | 1/2007 | Zhe et al. | 257/704 |
| 2008/0175425 A1 | 7/2008 | Roberts et al. | 381/361 |
| 2008/0315333 A1 | 12/2008 | Combi et al. | 257/415 |
| 2009/0057876 A1 | 3/2009 | Chien et al. | 257/704 |
| 2010/0013067 A9 | 1/2010 | Zhang et al. | 257/669 |
| 2010/0086164 A1 | 4/2010 | Gong et al. | 381/369 |
| 2010/0128914 A1 | 5/2010 | Khenkin | 381/361 |
| 2010/0183181 A1 | 7/2010 | Wang | 381/361 |
| 2011/0057273 A1 | 3/2011 | O'Donnell et al. | 257/414 |
| 2012/0027234 A1 | 2/2012 | Goida | 381/150 |
| 2012/0091545 A1 * | 4/2012 | Reichenbach et al. | 257/416 |
| 2012/0189144 A1 * | 7/2012 | Delaus et al. | 381/174 |
| 2013/0058509 A1 * | 3/2013 | Mietta et al. | 381/174 |

* cited by examiner

US 8,841,738 B2

MEMS MICROPHONE SYSTEM FOR HARSH ENVIRONMENTS

TECHNICAL FIELD

The invention generally relates to microphones and, more particularly, the invention relates to packaged microphones for harsh environments

BACKGROUND ART

Microelectromechanical system ("MEMS") condenser microphone dies typically have a diaphragm that forms a variable capacitor with an underlying backplate. Receipt of an audio signal causes the diaphragm to vibrate and generate a variable capacitance signal representing the audio signal. This variable capacitance signal can be amplified, recorded, or otherwise transmitted to another electronic device. Such microphones typically are enclosed in a package to shield sensitive microphone components from environmental conditions.

These microphone packages have an aperture that allows acoustic signals to reach the microphone. Undesirably, in addition to allowing access for acoustic signals, the aperture can allow access to contaminants that can compromise microphone operation. For example, particles and moisture can enter the interior of the microphone and interfere with movement of the variable capacitor. Additionally, thermal expansion mismatches between the microphone die and the package materials on which the microphone die is mounted can limit the operating temperature range for these microphone systems. These problems often compromise condenser microphone systems operating in harsh environments having very high-temperatures, radio frequency interference/electromagnetic interference ("RFI"/"EMI"), and high volumes of airborne contaminants such as dirt, dust, and liquids.

SUMMARY OF EMBODIMENTS OF THE INVENTION

In a first embodiment of the invention there is provided a silicon MEMS microphone system in an integrated circuit package for use in harsh environments. The microphone system includes a package base which includes opposing first and second faces. The package base has a cavity in its first face and a first metal lid coupled to the first face of the package base covering the cavity to form an acoustic chamber. The package base includes an aperture through the second face of the package base for receiving audio signals into the acoustic chamber. A MEMS microphone is secured to the package base about the aperture within the acoustic chamber. A filter covers the aperture in the second face of the package base to prevent contaminants from reaching the microphone. A second metal lid encloses the second face of the base and the filter; includes an opening for allowing the audio signal to reach the acoustic chamber; and is electrically connected to the first metal lid, forming an EMI shield.

In some embodiments of the invention, the package base is a ceramic material providing a good thermal expansion match for the silicon microphone and any silicon processing elements attached to the package base. In preferred embodiments, the metal lids are connected with vias whose number and spacing reduces RFI that could affect microphone signals. The filter material may be a fabric with a controlled acoustic impedance and may be chosen from a polyetheretherketone fabric or a polytetrafluoroethylene fabric or an equivalent, in preferred embodiments of the invention. The microphone components may communicate with other system components external to the integrated circuit package by various means including side-brazed in-line leads, J-leads, gull-wing leads or by surface mounting the integrated circuit package on a circuit board, according to various embodiments of the invention.

BRIEF DESCRIPTION OF THE DRAWINGS

The foregoing features of embodiments will be more readily understood by reference to the following detailed description, taken with reference to the accompanying drawings, in which.

DETAILED DESCRIPTION OF SPECIFIC EMBODIMENTS

In an illustrative embodiment of the present invention, a microphone system is specially configured for use in harsh environments. For example, the microphone system should be capable of substantially normal operation in unusual and extreme situations, such as those with extreme temperature swings, high humidity and moisture (e.g., nautical environments), high shock (e.g., military environments), and very dry conditions (e.g., deserts). The system thus may be considered to be a "ruggedized" microphone system.

To that end, in summary, the microphone system may have a base with a cavity, and a solid metal lid covering the cavity forming an acoustic chamber containing a silicon microphone (i.e., a MEMS microphone). The package base includes an aperture from the acoustic chamber through the opposing face of the base for receiving audio signals into the chamber. To prevent contaminants from entering the acoustic chamber, the system also includes a filter covering the aperture opening in the opposing face of the base. A second metal lid encloses the opposing face of the base. To protect the silicon microphone from electromagnetic interference (a/k/a "EMI"), vias or other electrical interconnectors electrically connect the lids to form an EMI shield (also referred to as an "RF interference shield"). Finally, the base material preferably is thermally matched to the silicon microphone to permit use across a wide range of temperatures. Details of various illustrative embodiments are presented below.

Figure 1:
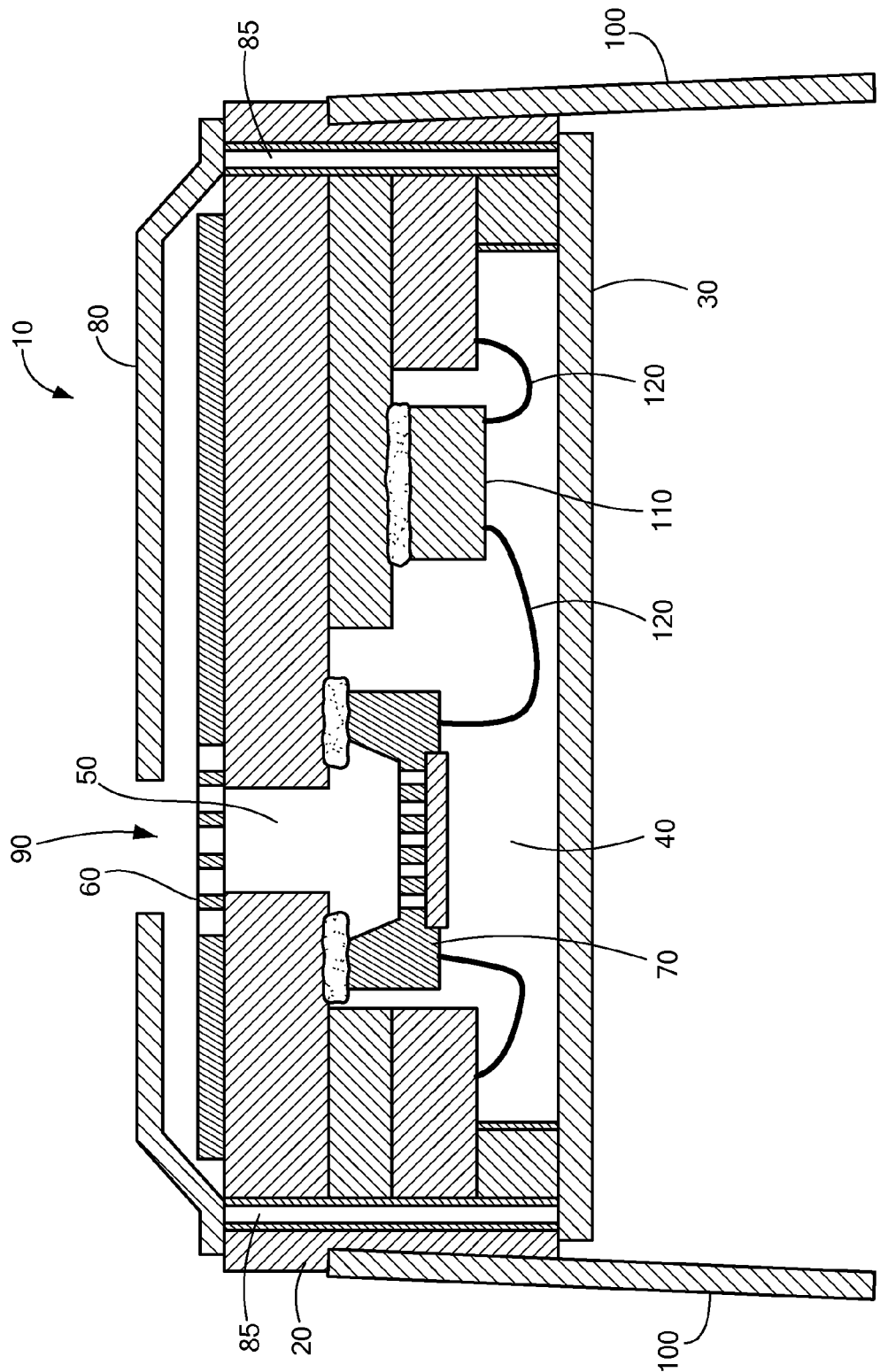
FIG. 1 schematically shows a cross-sectional view of a microphone system configured in accordance with illustrative embodiments of the invention.

FIG. 1 schematically shows a cross-sectional view of a microphone system 10 according to an illustrative embodiment of the invention. As known by those in the art, the microphone system (also known as a "packaged microphone") may be mounted to a larger system, such as a printed circuit board of a larger system. For example, the larger system may be a mobile telephone, and the printed circuit board may position the microphone system 10 near an opening in its external housing to receive a voice signal. The printed circuit board also may have many components other than the microphone, such as power circuitry, filters, etc., that may or may not directly control the microphone system 10. In fact, the system printed circuit board may be a daughterboard that is secured to a larger printed circuit board (i.e., a motherboard).

The microphone system 10 shown may be considered to be a top port, cavity down design. This "top port" designation is due to the fact that its port 90 (see below for details of the port) is on the side of the package that, when secured to the system printed circuit board, is farthest from the board—it is on the top of the package from that perspective. In a corresponding manner, the "cavity down" designation is due to the fact that the cavity 40 (also discussed below) is concave from the perspective of the printed circuit board when mounted.

To those ends, the microphone system 10 includes a package base 20 forming the noted cavity 40, and a solid metal lid 30 secured over the cavity 40. This connection of the lid 30 over the cavity 40 forms an acoustic chamber. The base 20 forms an aperture 50 through the opposing faces for entry of an acoustic signal (e.g., a sound signal) into the acoustic chamber.

Figure 2:
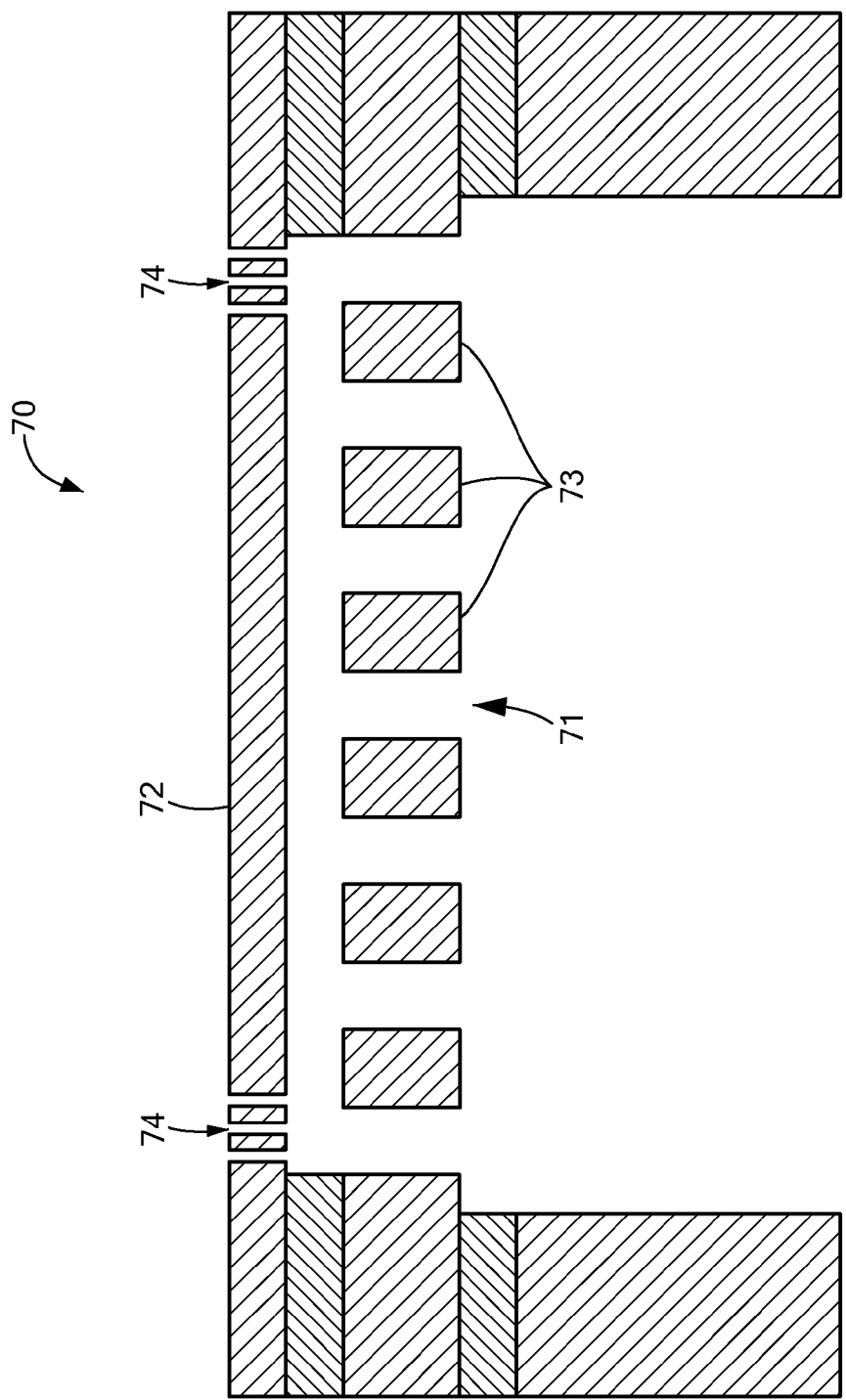
FIG. 2 schematically shows a cross-sectional view of the microphone in the system of FIG. 1.

A silicon microphone 70 (i.e., a MEMS microphone) is attached to the first face of the base about the aperture 50. FIG. 2 schematically shows a cross-sectional view of the silicon microphone 70 in accordance with illustrative embodiments of the invention. Among other things, the microphone 70 includes a static backplate 71 that supports and forms a variable capacitor with a flexible diaphragm 72. In illustrative embodiments, the backplate 71 and diaphragm 72 each are formed from single crystal silicon (e.g., the top layer of a silicon-on-insulator wafer, discussed below). Alternatively, the diaphragm 72 is formed from a film of silicon-based material, such as polysilicon, silicon carbide, or silicon germanium. In a similar manner, other types of materials can form the backplate 71. For example, the backplate 71 can be formed from a relatively low temperature film, such as silicon germanium. If thermal budget is not a primary issue, the backplate 71 can be formed from high temperature materials, such as polysilicon, silicon carbide, or silicon germanium.

To facilitate operation, the backplate 71 has a plurality of through-hole apertures ("backplate apertures 73") that lead to a backside cavity 40. Springs 74 movably connect the diaphragm 72 to a static/stationary portion of the microphone 70, which includes a substrate that at least in part includes the backplate 71. The springs 74 effectively form a plurality of openings that permit at least a portion of the audio signal to pass through the microphone 70. These openings may be any reasonable shape, such as in the shape of a slot, round hole, or some irregular shape.

The aperture 50 thus forms a top port for the microphone system 10. The microphone system 10 thus has an enlarged back volume, which primarily includes the acoustic chamber formed by the cavity 40 and the lid 30. As known by those in the art, this enlarged back volume enhances performance of the entire system 10. Moreover, to prevent contaminants from reaching sensitive microstructure forming the variable capacitor of the microphone, the aperture opening 50 preferably is covered by a filter 60. The filter should be selected to permit easy access to desired acoustic signals while mitigating the potential of access of undesired particles.

A second metal lid 80 is attached to the opposing face of the base 20. The second metal lid includes an opening 90 to allow sound to reach the aperture 50 opening. In some embodiments, this second metal lid has a raised portion that forms a front volume over the face to which it is mounted. Such a front volume is optional, however, and thus, may be omitted.

In illustrative embodiments, the first and second metal lids 30 and 80 are electrically connected to form an EMI shield about the microphone die 70. The two metal lids 30 and 80 at least in part form a Faraday cage that should mitigate the impact of EMI. Accordingly, the microphone system 10 has an electrical interconnection between the two lids 30 and 80, ensuring they are at substantially the same electric potential. To that end, the system shown in FIG. 1 has a plurality of vias 85, forming an enclosure that reduces EMI that could inject noise into microphone signals.

Figure 3:
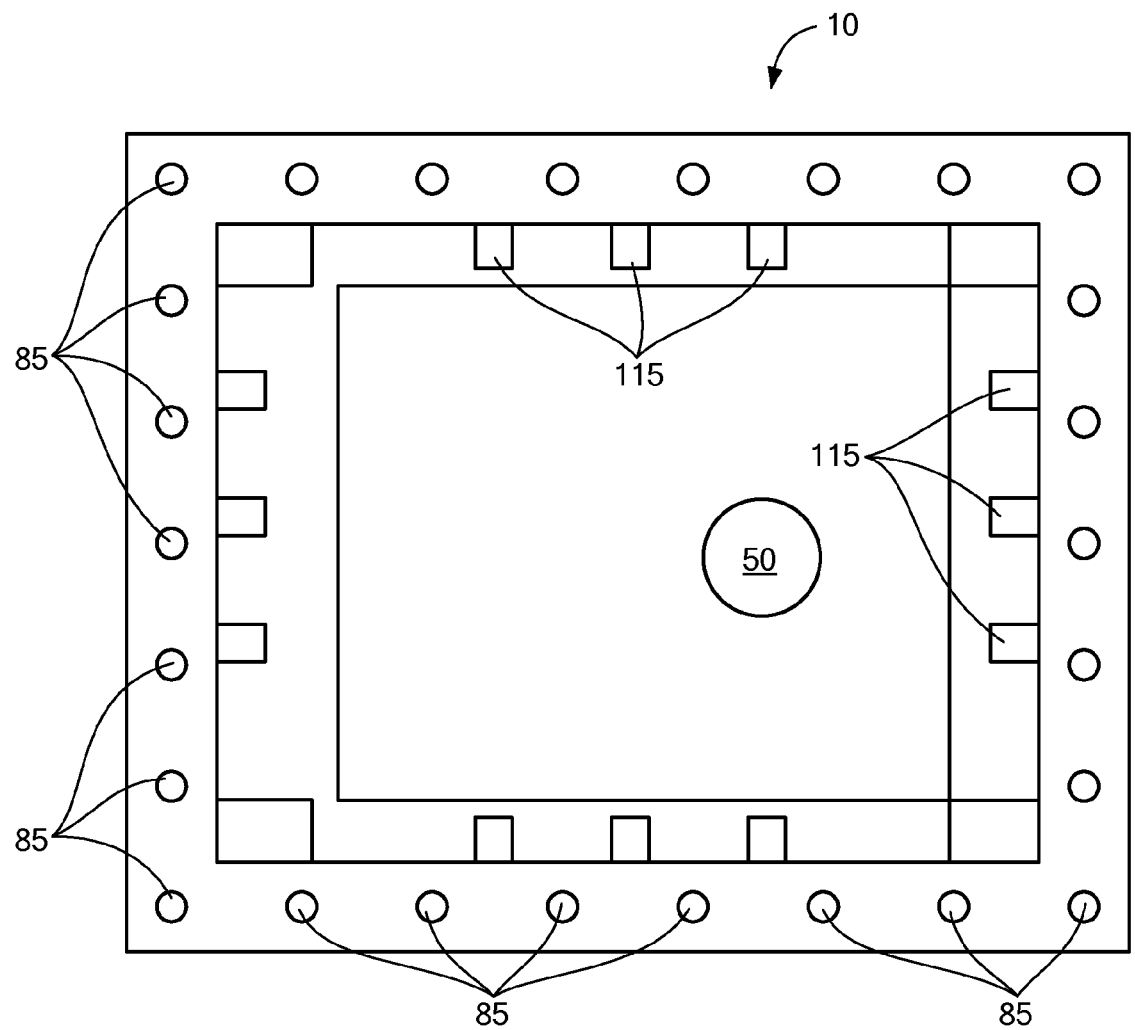
FIG. 3 schematically shows a top view of the microphone system of FIG. 1, without the lid.

In some embodiments, the microphone system 10 has a specialized circuit die 110 that controls operation of the microphone die 70. To that end, the die 110 may be implemented as an application specific integrated circuit ("ASIC 110") attached to the first face of the package base 20 (i.e., within the cavity 40). Wire bonds 120 connect this circuit element die 110 to the microphone 70, and one or both of the microphone die 70 and ASIC 110 to pads on the base 20. FIG. 3, a top down view of the microphone system without the package lid 80, shows the pads 115. The pads 115 also attach the wire bonds 120 (and, consequently the microphone 70 and ASIC 110) to the interconnects (discussed below) that connect the system 10 to the noted system printed circuit board.

FIG. 2 also shows vias 85 that connect the metal lids 30, 80. The number and spacing of the vias 85 can be chosen such that EMI can be suppressed by the combination of the two metal lids and the vias.

The microphone system 10 can use any of a wide variety of electrical interconnection systems to electrically and mechanically connect with an underlying system circuit board or base. For example, FIG. 1 shows a plurality of leads 100 extending from the base to allow the microphone die 70 (and ASIC die 110, described below) to communicate with other electronic elements (not shown). As shown in FIG. 1, such leads 100 may be side brazed in-line leads for connecting directly to a circuit board (or to a socket). Alternatively, the leads may be J-leads or gull-wing leads (not shown) for surface mounting the microphone system package to a circuit board. In yet other embodiments, the system 10 can have pads (not shown) for surface mounting with the underlying system.

The package base 20 material may be chosen so that its coefficient of thermal expansion ("CTE") closely matches the CTE of the microphone 70 and that of the ASIC 110. Accordingly, mitigating the CTE mismatch should mitigate thermal stress between the base 20 and microphone system elements, favorably expanding the operating temperature range of the overall microphone system. In preferred embodiments, the package base material is a ceramic, which has a CTE that is close to that of silicon. The ceramic material for the base may be chosen from a variety of ceramic materials including, by way of example but not for limitation, aluminum nitride and aluminum oxide (alumina). The ceramic package base may be fabricated by a high temperature co-fired ceramic process, by a low temperature co-fired ceramic process, or by another process as is known in the art.

In other embodiments of the invention, materials other than ceramics may be used for the package base, such as a plastic or a composite material, e.g., FR-4 epoxy laminate. In preferred embodiments of the invention using a ceramic package base, the operating temperature range of these microphone systems can extend from about −55 degrees C. to about 215 degrees C. and beyond.

The above noted filter 60 should seal the acoustic chamber from many contaminants. To that end, the filter can be attached to the opposing face of the package base 20 with adhesive, such as, for example, an epoxy adhesive. In some embodiments of the invention, the filter is attached to the package base by a form-fitting second metal lid 80, either with or without adhesive applied to the package base. The filter material may be chosen from any of the high temperature acoustic fabrics that are known in the art. These fabrics provide a controlled acoustic impedance and may include, among other things, polyetheretherketone ("PEEK") fabric, polytetrafluoroethylene ("PTFE") fabric, or their equivalents. The filter may also be formed in the second metal lid 80. For example, the filter may be formed by sintering. The filter may also be formed in the package base, for example, by sintering.

It should be noted that discussion of a top port, cavity down package is but one of a number of different potential embodiments. For example, some embodiments may use a bottom port design, with the cavity either up or down. As another example, some embodiments may have a cavity up design with either a top or bottom port design. Moreover, rather than solid metal lids 30 and 80, some embodiments may be formed from another material, or a composite, layered set of materials. For example, some embodiments may use metal plated lids, conductive or nonconductive plastic lids, or plastic lids with metal layers. The type of lid and configuration depends on the intended application.

In fact, some embodiments may omit one of the lids 30 and 80. Alternatively, other embodiments may use one lid formed from one set of materials (e.g., a solid metal lid) and another lid 30 or 80 formed from another set of materials (e.g., a plastic lid). Accordingly, discussion of solid metal lids 30 and 80 is for illustrative purposes only and is not intended to limit all embodiments.

Fabrication Process for MEMS Microphone System

Figure 4:
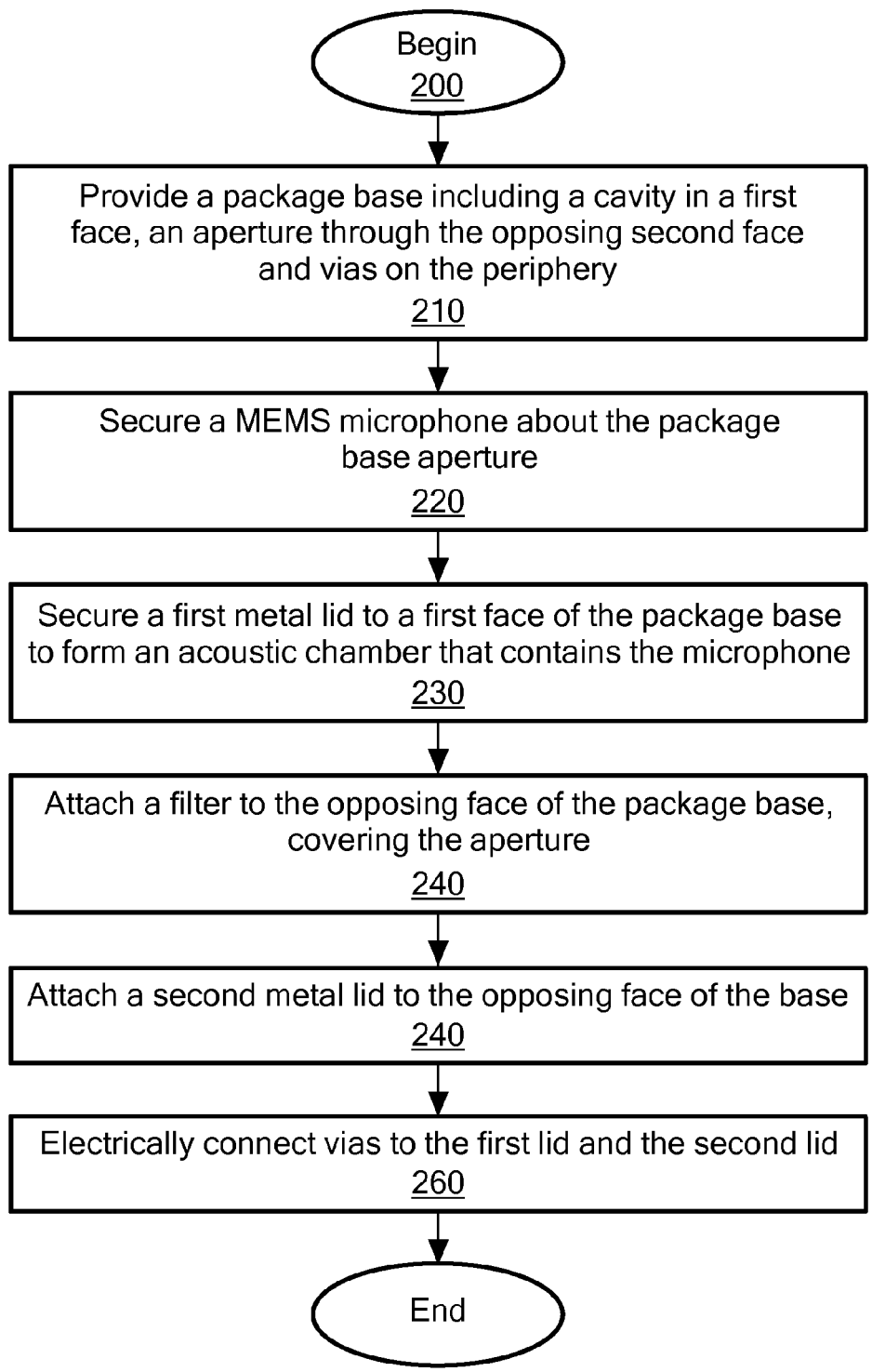
FIG. 4 illustrates a process for fabricating the microphone system of FIG. 1 in accordance with illustrative embodiments of the invention.

FIG. 4 shows a process of fabricating the microphone system 10 in accordance with illustrative embodiments of the invention. It should be noted that for simplicity, this described process is a significantly simplified version of an actual process used to form the microphone system 10. Accordingly, those skilled in the art would understand that the process may have additional steps not explicitly shown in FIG. 4. Moreover, some of the steps may be performed in a different order than that shown, or at substantially the same time. Those skilled in the art should be capable of modifying the process to suit their particular requirements.

The process begins at step 210, which provides a package base 20 having opposing first and second faces with the base. As shown in FIG. 1 and discussed above, the base has the cavity 40 in the first face, vias 85, and the aperture 50 through its second face. The process then secures both 1) the MEMS microphone 70 in the cavity about the package base aperture (step 220), and 2) the ASIC 110 next to the microphone in the same cavity. Among other ways, the process may use a conductive or insulative adhesive to secure bottom sides of both chips to the cavity. Wire bonds 120 may be placed to connect ASIC 110 to the microphone 70, and one or both of the microphone die 70 and ASIC 110 to pads 115 on the base 20.

Next, the process attaches the first metal lid 30 (step 230) to the first face of the package base 20 to form the acoustic chamber, which contains the microphone. In addition, this step also electrically and mechanically connects the first metal lid 30 with the vias 80. A filter 60 then is attached (step 240) to the opposing face of the package base, covering the aperture 50. The process then may secure second metal lid 80 (step 250) to the opposing face of the base in a manner that mechanically and electrically connects with the vias (step 260). Accordingly, this also electrically connects both lids, forming the EMI shield. Among other ways, the lids may be attached to the package base by low temperature soldering using solder such as a tin-silver-copper alloy. Alternatively, attachment of the lids may be accomplished with seam welding, or by using a conductive adhesive.

Accordingly, illustrative embodiments permit use of a MEMS microphone in a wider variety of environments. The CTE matched base and dies enables a wider temperature variation, while the opposing lids provide EMI protection and a more robust package. Moreover, the filter further limits particle access to the sensitive microstructure of the MEMS variable capacitor.

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. A microphone system in an integrated circuit package comprising:
    a package base including opposing first and second faces, the package base including a cavity in the first face;
    a first metal lid coupled to the first face of the package base covering the cavity and forming an acoustic chamber, the package base including an aperture through the second face of the package base for receiving an audio signal into the acoustic chamber;
    a filter covering the aperture in the second face of the package base;
    a silicon microphone secured to the package base about the aperture within the acoustic chamber; and
    a second metal lid enclosing the second face of the package base and the filter, the second metal lid electrically connected to the first metal lid, the second metal lid including an opening for allowing the audio signal to reach the acoustic chamber.

2. The microphone system as defined by claim 1 wherein the package base material is a ceramic.

3. The microphone system as defined by claim 1 wherein the package base material is chosen from a group consisting of alumina and aluminum nitride.

4. The microphone system as defined by claim 1 wherein the filter is attached to the package base by the second metal lid.

5. The microphone system as defined by claim 1 wherein the second metal lid includes the filter.

6. The microphone system as defined by claim 1 wherein the filter comprises a polyetheretherketone fabric.

7. The system as defined by claim 1 wherein the filter is chosen from a group consisting of a polytetrafluoroethylene fabric and a sintered metal mesh.

8. The microphone system as defined by claim 1 wherein the filter has a controlled acoustic impedance.

9. The microphone system as defined by claim 1 further comprising a processing element secured within the acoustic chamber, the processing element electrically communicating with the silicon microphone.

10. The microphone system as defined by claim 1 further comprising in-line package leads side-brazed to a lead frame.

11. The microphone system as defined by claim 1 further comprising J-lead package leads.

12. The microphone system as defined by claim 1 further comprising gull-wing package leads.

13. The microphone system as defined by claim 1 where the integrated circuit package is surface-mounted.

14. The microphone system as defined by claim 1 wherein the first metal lid and the second metal lid are connected with vias, where the vias are spaced such that radio frequency interference is reduced.

15. A method of forming a microphone system, the method comprising:

providing a package base including opposing first and second faces, the base including a cavity in the first face, vias, and an aperture through the second face;

securing a MEMS microphone about the package base aperture;

securing a first metal lid to the first face of the package base to form an acoustic chamber including the cavity, wherein the acoustic chamber contains the microphone;

attaching a filter to the second face of the package base wherein the filter covers the aperture; and attaching a second metal lid to the second face of the base; and electrically connecting the vias to each of the first metal lid and the second metal lid such that the first metal lid and the second metal lid are electrically connected.

16. The method of claim 15 wherein the package base is ceramic.

17. The method of claim 15 wherein the first and second metal lids are attached to the package base by seam welding.

18. The method of claim 15 wherein the first and second metal lids are attached to the package base by soldering.

19. The microphone system as defined by claim 1 wherein the silicon microphone being positioned between the cavity and the filter.

20. The microphone system as defined by claim 1 wherein the silicon microphone being secured to the package base about the aperture within the acoustic chamber.

21. The microphone system as defined by claim 1 wherein the silicon microphone including a diaphragm and an electrode capacitively coupled together.

22. The microphone system as defined by claim 1 wherein the filter being positioned between the aperture and the second metal lid.

23. The microphone system as defined by claim 1 wherein the filter being positioned in a manner such as to avoid contamination.

24. The microphone system as defined by claim 1 further including a microphone die situated between the cavity and the aperture and implemented as an application specific integrated circuit (ASIC), the ASIC being attached to the first face of the package base within the cavity.

25. The microphone system as defined by claim 1 wherein the first and second metal lids form an EMI shield.

26. The method of claim 15 wherein the filter being positioned sufficiently away from the microphone to avoid contamination thereof.

* * * * *